(12) United States Patent
Kim et al.

(10) Patent No.: US 11,978,519 B2
(45) Date of Patent: May 7, 2024

(54) STORAGE DEVICE AND OPERATING METHOD THEREOF

(71) Applicant: SK hynix Inc., Icheon (KR)

(72) Inventors: Jung Ae Kim, Icheon (KR); Jee Yul Kim, Icheon (KR)

(73) Assignee: SK hynix Inc., Icheon (KR)

( * ) Notice: Subject to any disclaimer, the term of this patent is extended or adjusted under 35 U.S.C. 154(b) by 177 days.

(21) Appl. No.: 17/570,323

(22) Filed: Jan. 6, 2022

(65) Prior Publication Data

US 2023/0010029 A1 Jan. 12, 2023

(30) Foreign Application Priority Data

Jul. 6, 2021 (KR) .................. 10-2021-0088744

(51) Int. Cl.
*G11C 7/00* (2006.01)
*G11C 7/04* (2006.01)
*G11C 16/10* (2006.01)
*G11C 16/14* (2006.01)
*G11C 16/26* (2006.01)
*G11C 16/30* (2006.01)
*G11C 16/34* (2006.01)

(52) U.S. Cl.
CPC ............ *G11C 16/3418* (2013.01); *G11C 7/04* (2013.01); *G11C 16/102* (2013.01); *G11C 16/14* (2013.01); *G11C 16/26* (2013.01); *G11C 16/30* (2013.01)

(58) Field of Classification Search
CPC ... G11C 7/04; G11C 11/406; G11C 11/40626; G11C 5/147; G11C 5/143

USPC ........................................................ 365/211
See application file for complete search history.

(56) References Cited

U.S. PATENT DOCUMENTS

2015/0301744 A1* 10/2015 Kim ................... G06F 3/0679
  711/103
2017/0052551 A1* 2/2017 Bang ................... G06F 3/0673

FOREIGN PATENT DOCUMENTS

| KR | 100466186 B1 | 5/2005 |
| KR | 102083496 B1 | 3/2020 |
| KR | 1020200095903 A | 8/2020 |

* cited by examiner

*Primary Examiner* — Son T Dinh

(57) ABSTRACT

A storage device performs a read operation, based on a temperature measured in a program operation or an erase operation. The storage device includes: a memory device including a plurality of memory blocks, the memory device measuring a temperature in a program operation or an erase operation; and a memory controller for setting an area in which the measured temperature is to be stored in the memory device, and controlling a read operation to be performed in the memory device. When a read command for a selected page among a plurality of pages included in each of the plurality of memory blocks is received from the memory controller, the memory device determines a read voltage and a pass voltage based on a temperature corresponding to the selected page and performs a read operation on the selected page by using the read voltage and the pass voltage.

20 Claims, 14 Drawing Sheets

FIG. 7

| PAGE1_1 | T_PGM11 | T_ERS1  | T_PGM13 |
|---------|---------|---------|---------|
| PAGE1_2 | T_ERS1  | T_PGM21 | T_PGM22 |
| PAGE1_3 | T_PGM31 | T_ERS1  | -       |
| PAGE1_4 | T_ERS1  | -       | -       |

FIG. 8A

| T_PGM | VREADR   | VPASSR   |
|-------|----------|----------|
| T11   | VREADR11 | VPASSR11 |
| T12   | VREADR12 | VPASSR12 |
| T13   | VREADR13 | VPASSR13 |
| T14   | VREADR14 | VPASSR14 |

FIG. 8B

| T_ERS | VREADR   | VPASSR   |
|-------|----------|----------|
| T21   | VREADR21 | VPASSR21 |
| T22   | VREADR22 | VPASSR22 |
| T23   | VREADR23 | VPASSR23 |
| T24   | VREADR24 | VPASSR24 |

STORAGE DEVICE AND OPERATING METHOD THEREOF

CROSS-REFERENCE TO RELATED APPLICATION

The present application claims priority under 35 U.S.C. § 119(a) to Korean patent application number 10-2021-0088744, filed on Jul. 6, 2021, in the Korean Intellectual Property Office, the entire disclosure of which is incorporated herein by reference.

BACKGROUND

1. Technical Field

The present disclosure generally relates to an electronic device, and more particularly, to a storage device and an operating method thereof.

2. Related Art

A storage device is a device configured to store data under the control of a host device such as a computer, a smart phone, or a smart pad. The storage device includes a device configured to store data on a magnetic disk, such as a Hard Disk Drive (HDD), and a device configured to store data in a semiconductor memory, particularly, a nonvolatile memory, such as a Solid State Drive (SSD) or a memory card.

The storage device may include a memory device configured to store data and a memory controller configured to control the memory device. The memory device is classified into a volatile memory device and a nonvolatile memory device. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), or the like.

As a temperature of the storage device changes, reliability of data stored in the storage device may not be ensured.

SUMMARY

Embodiments provide a storage device for performing a read operation based on a temperature measured in a program operation or an erase operation, and an operating method of the storage device.

In accordance with an aspect of the present disclosure, there is provided a memory device including: a plurality of memory blocks each including a plurality of pages; a temperature circuit configured to measure, for each of the plurality of pages, a temperature when the memory device performs a program operation or an erase operation; a temperature information storage configured to store the temperature that is measured for each of the plurality of pages; and a voltage controller configured to determine, based on the temperature, a read voltage and a pass voltage to be used in a read operation on a selected page among the plurality of pages.

In accordance with another aspect of the present disclosure, there is provided a method performed by a memory device that includes a plurality of memory blocks each including a plurality of pages, the method including: measuring a temperature for each page in a program operation or an erase operation, and storing the measured temperature for each page; determining, based on the measured temperature for each page, a read voltage and a pass voltage, corresponding to a selected page among the plurality of pages; and performing a read operation on the selected page by using the read voltage and the pass voltage.

In accordance with still another aspect of the present disclosure, there is provided a memory controller for controlling a memory device, the memory controller including: a storage area controller configured to set an area in which a temperature measured when the memory device performs a program operation or an erase operation is to be stored in the memory device; and a read operation controller configured to receive, from the memory device, voltage information on a read voltage and a pass voltage, which are determined based on the measured temperature, and control a read operation to be performed in the memory device based on the voltage information.

In accordance with still another aspect of the present disclosure, there is provided a storage device including: a memory device including a plurality of memory blocks, the memory device measuring a temperature in a program operation or an erase operation; and a memory controller configured to set an area in which the measured temperature is to be stored in the memory device, and control a read operation to be performed in the memory device, wherein, when a read command for a selected page among a plurality of pages included in each of the plurality of memory blocks is received from the memory controller, the memory device determines a read voltage and a pass voltage based on a temperature corresponding to the selected page and performs a read operation on the selected page by using the read voltage and the pass voltage.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 7 illustrates temperature information stored in a temperature information storage.

FIG. 8A illustrates reference read voltages and reference pass voltages according to temperatures measured in a program operation.

FIG. 8B illustrates reference read voltages and reference pass voltages according to temperatures measured in an erase operation.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
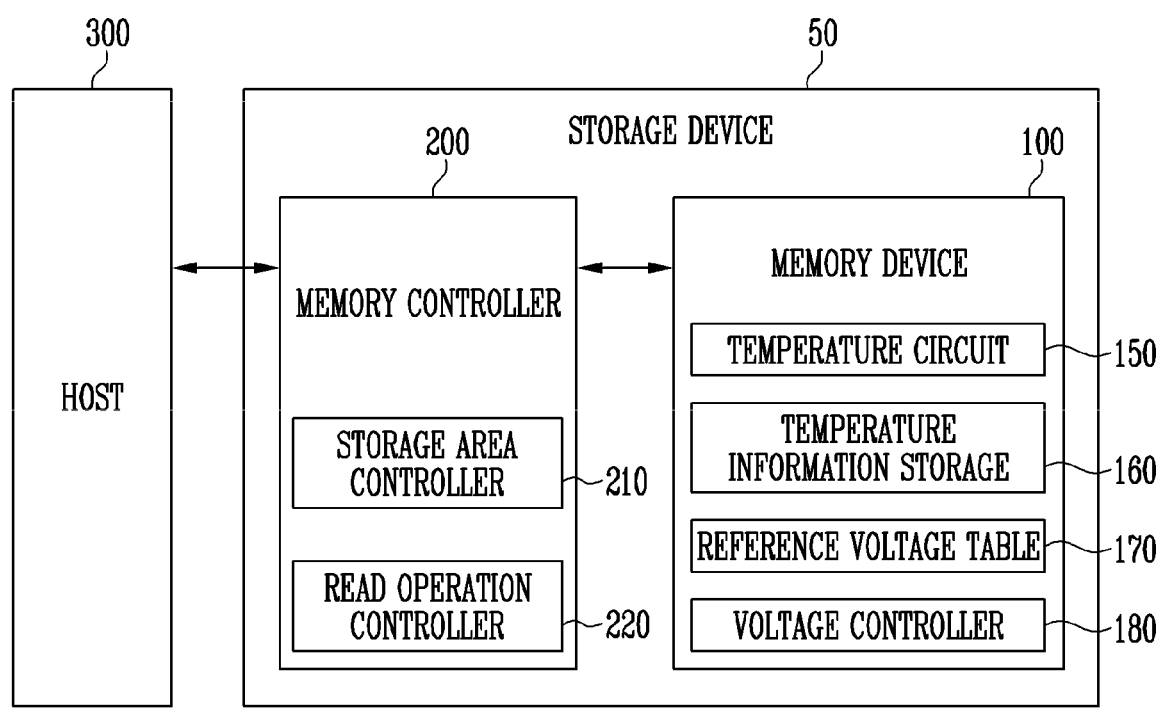
FIG. 1 illustrates a storage device in accordance with an embodiment of the present disclosure.

FIG. 1 illustrates a storage device 50 in accordance with an embodiment of the present disclosure.

Referring to FIG. 1, the storage device 50 may include a memory device 100 and a memory controller 200.

The storage device 50 may be a device for storing data under the control of a host 300 such as a mobile phone, a smart phone, an MP3 player, a laptop computer, a desktop computer, a game console, a TV, a tablet PC, an in-vehicle infotainment, or the like.

The storage device 50 may be manufactured as any one of various types of storage devices according to a host interface that is a communication scheme with the host 300. For example, the storage device 50 may be implemented with any one of a variety of types of storage devices such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), a Wafer-level Stack Package (WSP), and the like.

The memory device 100 may store data. The memory device 100 operates under the control of the memory controller 200. The memory device 100 may include a memory cell array. The memory cell array may include a plurality of memory blocks. Each memory block may include a plurality of memory cells, and the plurality of memory cells may constitute a plurality of pages. In an embodiment, a page may be a unit for storing data in the memory device 100 or reading data stored in the memory device 100. A memory block may be a unit for erasing data stored in the memory device 100.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR) SDRAM, a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (SU-RAM), or the like. In this specification, for convenience of description, a case where the memory device 100 is a NAND flash memory is assumed and described.

In an embodiment, the memory device 100 may be implemented in a two-dimensional array structure or a three-dimensional array structure. Hereinafter, although a case where the memory device 100 is implemented in the three-dimensional array structure is described as an embodiment, embodiments are not limited to the three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, the memory device 100 may operate by using a Single Level Cell (SLC) method in which one-bit data is stored in one memory cell. Alternatively, the memory device 100 may operate by using a method in which at least two-bit data is stored in one memory cell. For example, the memory device 100 may operate by using a Multi-Level Cell (MLC) method in which two-bit data is stored in one memory cell, a Triple Level Cell (TLC) method in which three-bit data is stored in one memory cell, or a Quadruple Level Cell (QLC) method in which four-bit data is stored in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (or program) operation, a read operation, and an erase operation according to the received command. For example, when a program command is provided thereto, the memory device 100 may program data in the area selected by the address. When a read command is provided thereto, the memory device 100 may read data from the area selected by the address. When an erase command is provided thereto, the memory device 100 may erase data stored in the area selected by the address.

In an embodiment, the storage device 50 may be an automotive storage device. The automotive storage device 50 may operate in a temperature range of −40° C. to 105° C. The temperature range in which the automotive storage device is operable may be wider than that in which a mobile storage device 50 is operable.

Therefore, in the case of the automotive storage device, retention or shifting of a threshold voltage distribution of memory cells may occur, and hence the memory device 100 and the memory controller 200 may malfunction. In addition, when the shifting of the threshold voltage distribution of the memory cells occurs, an error correction operation (e.g., a read retry operation, etc.) is performed in a read operation, and therefore, latency may be increased. Further, when an error of read data is not corrected even though the error correction operation has been performed, uncorrectable error correction codes (UECC) may be generated.

Accordingly, in the present disclosure, there is proposed a method for minimizing a number of times an error correction operation is performed and ensuring reliability of the storage device 50 by measuring and storing a temperature when the memory device 100 operates and performing a read operation based on the stored temperature.

In an embodiment, the memory device 100 may include a temperature circuit 150. The temperature circuit 150 may measure a temperature when the memory controller 200 and/or the memory device 100 operate. The temperature circuit 150 may generate and output temperature information on the measured temperature. The temperature information may be data which is not randomized.

For example, the temperature circuit 150 may measure a temperature for each page in a program operation or an erase operation of the memory device 100. Also, the temperature circuit 150 may generate and output temperature information corresponding to the measured temperature for each page.

In an embodiment, the memory device 100 may include a temperature information storage 160 and a reference voltage table 170 that include information associated with the measured temperature for each page.

In an embodiment, the temperature information storage 160 may store the temperature information received from the temperature circuit 150. In order to ensure the reliability of the temperature information, the temperature information storage 160 may store the temperature information a specific number of times (e.g., eight times). When the temperature information is stored in the temperature information storage 160 the specific number of times, validity of the temperature information may be checked through majority check.

In an embodiment, the temperature information storage 160 may correspond to a page at a specific position among pages included in each memory block (e.g., a last page of each memory block), a specific memory block among a plurality of memory blocks, or a register in which data is stored. The temperature information storage 160 may be designated through an operation corresponding to a set parameter command received from the memory controller 200 in a booting operation or an initialization operation of the storage device 50.

In an embodiment, the reference voltage table 170 may include information on a reference read voltage and a reference pass voltage, which correspond to the temperature measured in the program operation or the temperature measured in the erase operation. Reference read voltages and reference pass voltages, which are included in the reference voltage table 170, may be experimentally determined according to a prediction value of a threshold voltage distribution due to retention at each temperature.

The reference voltage table 170 may be configured as a one-time programmable (OTP) memory. Therefore, the memory controller 200 as well as the memory device 100 may access the reference voltage table 170.

In another embodiment, the reference voltage table 170 may be configured as a CAM (Content-Addressable Memory) block among the plurality of memory blocks included in the memory device 100.

In an embodiment, the memory device 100 may include a voltage controller 180. The voltage controller 180 may control a read voltage and a pass voltage in a read operation.

For example, when a read command is received from the memory controller 200, the voltage controller 180 may receive, from the temperature information storage 160, temperature information corresponding to a page on which the read command is to be executed. The temperature information received from the temperature information storage 160 corresponds to temperature information obtained when the page on which the read command is to be executed is programmed or erased. The voltage controller 180 may determine, as voltages at which the read command is to be executed, a read voltage and a pass voltage, which correspond to the temperature information received from the temperature information storage 160, among the reference read voltages and the reference pass voltages stored in the reference voltage table 170, based on the temperature information. The memory device 100 may perform a read operation corresponding to the read command by using the determined read voltage and the determined pass voltage.

The memory controller 200 may control overall operations of the storage device 50.

When a power voltage is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may execute firmware to receive data and a logical block address LBA from the host 300 and translate the logical block address LBA into a physical block address PBA corresponding to addresses of memory cells included in the memory device 100, the data being to be stored in the memory cells. Also, the memory controller 200 may store, in a buffer memory (not shown), a logical-to-physical address mapping table that establishes a mapping relationship between the logical block address LBA and the physical block address PBA.

The memory controller 200 may control the memory device 100 to perform a program operation, a read operation, an erase operation, or the like in response to a request from the host 300. For example, when a program request is received together with a logical block address LBA and write data from the host 300, the memory controller 200 may change the program request into a program command, and provide the memory device 100 with the program command, a physical block address PBA mapped to the logical block address LBA, and the write data. When a read request is received together with a logical block address LBA from the host 300, the memory controller 200 may change the read request into a read command, find a physical block address PBA corresponding to the logical block address LBA, and then provide the memory device 100 with the read command and the physical block address PBA. When an erase request is received together with a logical block address LBA from the host 300, the memory controller 200 may change the erase request into an erase command, find a physical block address PBA corresponding to the logical block address LBA, and then provide the memory device 100 with the erase command and the physical block address PBA.

In an embodiment, the memory controller 200 may control at least two memory devices. The memory controller 200 may control the at least two memory devices according to an interleaving scheme so as to improve operational performance.

In an embodiment, the memory controller 200 may include a storage area controller 210. The storage area controller 210 may output a set parameter command to the memory device 100 in a booting operation or an initialization operation of the storage device 50. The set parameter command may be a command for instructing the memory device 100 to designate an area in which temperature information on a temperature measured by the temperature circuit 150 is to be stored. That is, the storage area controller 210 outputs the set parameter command to designate the temperature information storage 160 in which the temperature information is to be stored.

A page at a specific position among pages included in each memory block (e.g., a last page of each memory block), a specific memory block among a plurality of memory blocks, or a register may be determined as the temperature information storage 160 in response to the set parameter command output from the storage area controller 210.

In an embodiment, the memory controller 200 may include a read operation controller 220. The read operation controller 220 may control a read operation to be performed in the memory device 100.

For example, the read operation controller 220 may receive voltage information from the voltage controller 180 of the memory device 100. The voltage information may be directly output from the voltage controller 180. Alternatively, the voltage information may be provided through the use of read data, status information, or the like.

When the voltage information is received from the memory device 100, the read operation controller 220 may output a read command to the memory device 100, based on the voltage information, in a subsequent read operation to be performed on a page corresponding to the voltage information. That is, the read operation controller 220 may output, to the memory device 100, the read command for instructing the memory device 100 to perform the subsequent read operation by using a read voltage and a pass voltage, which are included in the voltage information.

Consequently, the read operation controller 220 determines in advance the read voltage and the pass voltage based on the voltage information, so that an operation in which the voltage controller 180 determines the read voltage and the pass voltage can be omitted for the subsequent read operation. Thus, a speed of a read operation can be increased.

The host 300 may communicate with the storage device 50 using at least one of various communication manners such as a Universal Serial bus (USB), a Serial Advanced Technology Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD) card, a Multi-Media Card (MMC), an embedded MMC (eMMC), a Dual In-line Memory Module (DIMM), a Registered DIMM (RDIMM), a Load Reduced DIMM (LRDIMM), and so on.

Figure 2:
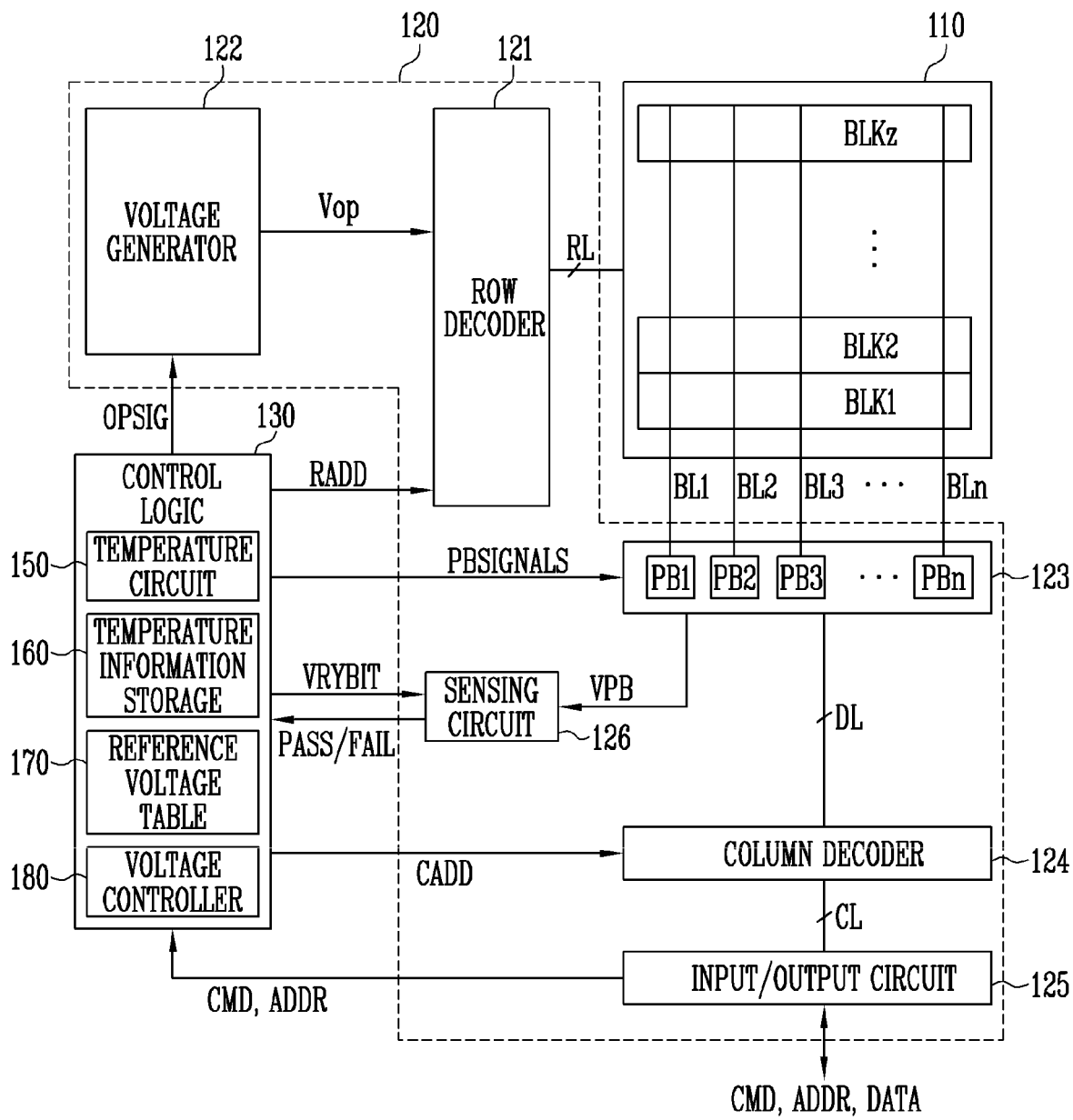
FIG. 2 illustrates a memory device shown in FIG. 1.

FIG. 2 illustrates the memory device 100 shown in FIG. 1.

Referring to FIG. 2, the memory device 100 may include a memory cell array 100, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may define one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one-bit data, a Multi-Level Cell (MLC) storing two-bit data, a Triple Level Cell (TLC) storing three-bit data, or a Quadruple Level Cell (QLC) storing four-bit data.

The peripheral circuit 120 may perform a program operation, a read operation, or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 decodes a row address RADD received from the control logic 130. The row decoder 121 selects at least one memory block among the memory blocks BLK1 to BLKz according to the decoded row address. Also, the row decoder 121 may select at least one word line WL of the selected memory block to apply voltages generated by the voltage generator 122 to the at least one word line WL according to the decoded row address.

For example, in a program operation, the row decoder 121 may apply a program voltage to the selected word line WL, and apply a program pass voltage having a level lower than that of the program voltage to unselected word lines. In a program verify operation, the row decoder 121 may apply a verify voltage to the selected word line WL, and apply a verify pass voltage having a higher level than the verify voltage to the unselected word lines. In a read operation, the row decoder 121 may apply a read voltage to the selected word line WL, and apply a read pass voltage having a higher level than the read voltage to the unselected word lines.

In an embodiment, an erase operation of the memory device 100 is performed in a memory block unit. In the erase operation, the row decoder 121 may select one memory block according to the decoded row address. In the erase operation, the row decoder 121 may apply a ground voltage to word lines connected to the selected memory block.

The voltage generator 122 operates under the control of the control logic 130. The voltage generator 122 generates a plurality of voltages by using an external power voltage supplied to the memory device 100. Specifically, the voltage generator 122 may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of voltages generated by the voltage generator 122 may be supplied to the memory cell array 110 by the row decoder 121.

The page buffer group 123 includes first to nth page buffers PB1 to PBn. The first to nth page buffers PB1 to PBn are connected to the memory cell array 110 respectively through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page are programmed according to the transferred data DATA. In a program verify operation, the first to nth page buffers PB1 to PBn read page data by sensing a voltage or current received from the selected memory cells through the first to nth bit lines BL1 to BLn.

In a read operation, the first to nth page buffers PB1 to PBn read data DATA from the memory cells of the selected page through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 in response to a column address CADD. For example, the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller 200 shown in FIG. 1, to the control logic 130, or exchange data DATA with the column decoder 124.

In a read operation or verify operation, the sensing circuit 126 may generate a reference current in response to an allow bit signal VRYBIT, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit signal VRYBIT in response to the command CMD and the address ADDR. For example, the control logic 130 may control a read operation of a selected memory block in response to a sub-block read command and an address. Also, the control logic 130 may control an erase operation of a selected sub-block included in the selected memory block in response to a sub-block erase command and an address. Also, the control logic 130 may determine whether the verify operation has passed or failed based on the pass or fail signal PASS or FAIL.

In an embodiment, the control logic 130 may include the temperature circuit 150, the temperature information storage 160, the reference voltage table 170, and the voltage controller 180. In another embodiment, the temperature circuit 150, the temperature information storage 160, the reference voltage table 170, and the voltage controller 180 may be located at the outside of the control logic 130 in the memory device 100.

In an embodiment, the temperature circuit 150 may measure a temperature of the memory device 100. For example, the temperature circuit 150 may measure the temperature when the memory device 100 performs a program operation or an erase operation. Specifically, the temperature circuit 150 may measure the temperature when the program operation or the erase operation is started, after the program operation or the erase operation is ended, or at a specific time during the program operation or the erase operation.

In an embodiment, the temperature information storage 160 may store temperature information including information on the temperature measured by the temperature circuit 150. The temperature information storage 160 may store temperature information for each page of the plurality of memory blocks BLK1 to BLKz.

Although a case where the temperature information storage 160 is included in the control logic 130 is illustrated in FIG. 2, the temperature information storage 160 may be a specific memory block among the plurality of memory blocks BLK1 to BLKz or pages at a specific position among a plurality of pages respectively included in the plurality of memory blocks BLK1 to BLKz.

In an embodiment, the reference voltage table 170 may include information on a reference read voltage and a reference pass voltage, which correspond to the temperature measured during the program operation or the temperature measured during the erase operation. Reference read voltages and reference pass voltages, which are included in the reference voltage table 170, may be experimentally determined according to a prediction value of a threshold voltage distribution due to retention at each temperature.

In an embodiment, the voltage controller 180 may determine a read voltage and a pass voltage in a read operation. For example, when a read command is received from the memory controller 200 shown in FIG. 1, the voltage controller 180 may receive, from the temperature information storage 160, temperature information corresponding to a page on which a read operation corresponding to the read command is to be performed. The voltage controller 180 may receive a reference read voltage and a reference pass voltage, which correspond to the temperature information, from the reference voltage table 170, and determine the reference read voltage and the reference pass voltage as the read voltage and the pass voltage, respectively, used in the read operation.

Figure 3:
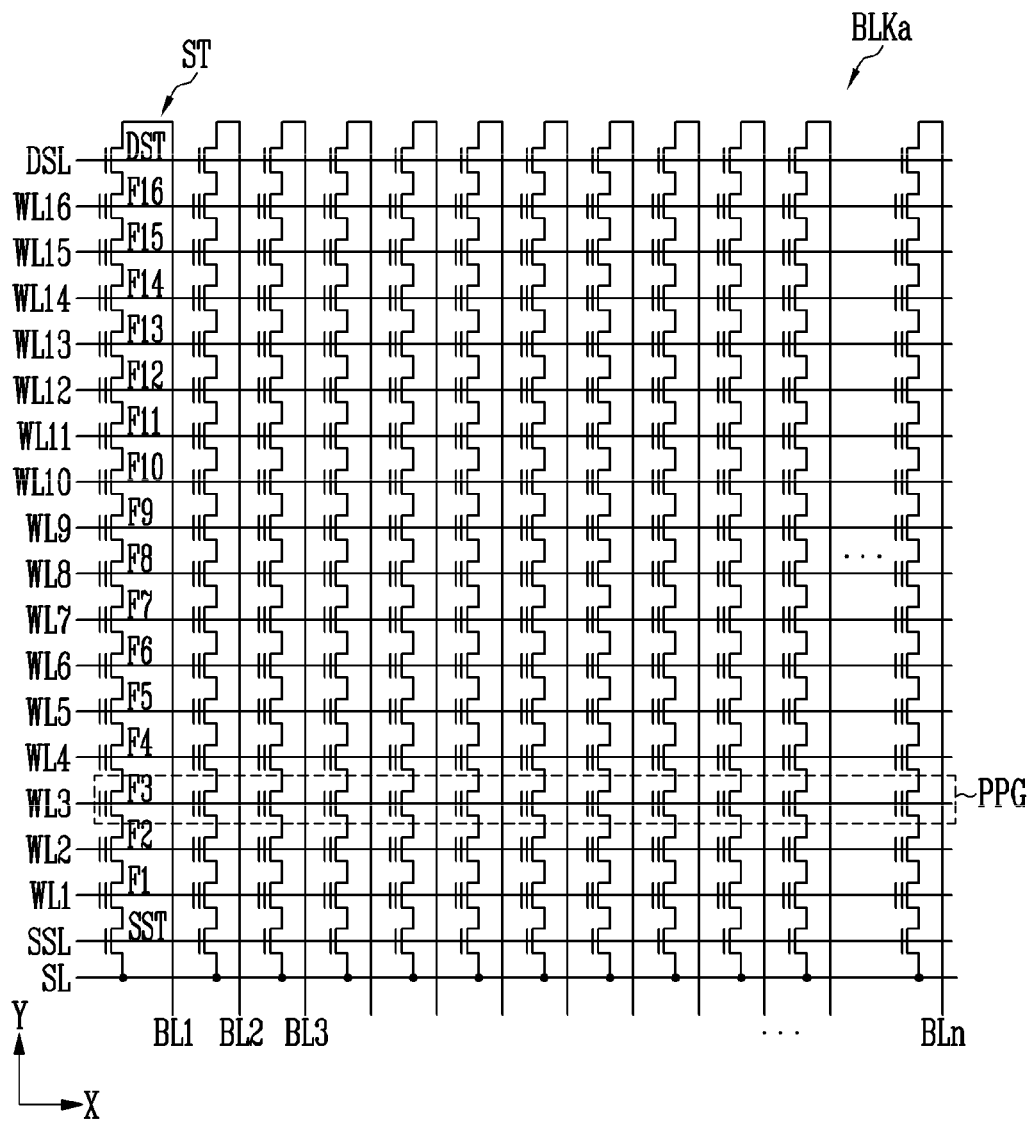
FIG. 3 illustrates a memory cell array shown in FIG. 2.

FIG. 3 illustrates the memory cell array 110 shown in FIG. 2.

FIG. 3 illustrates any one memory block BLKa among the plurality of memory blocks BLK1 to BLKz included in the memory cell array 110 shown in FIG. 2.

In the memory block BLKa, a first select line, word lines, and a second select line, which are arranged in parallel, may be connected to each other. For example, the word lines may be arranged in parallel between the first and second select lines. The first select line may be a source select line SSL, and the second select line may be a drain select line DSL.

More specifically, the memory block BLKa may include a plurality of strings connected between bit lines BL1 to BLn and a source line SL. The bit lines BL1 to BLn may be respectively connected to the strings, and the source line SL may be commonly connected to the strings. The strings may be configured identically to one another, and therefore, a string ST connected to a first bit line BL1 will be described in detail as an example.

The string ST may include a source select transistor SST, a plurality of memory cells F1 to F16, and a drain select transistor DAT, which are connected in series to each other between the source line SL and the first bit line BL1. At least one source select transistor SST and at least one drain select transistor DST may be included in one string ST, and memory cells of which number is greater than that of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings may be connected to the source select line SSL, and gates of drain select transistors DST included in different strings may be connected to the drain select line DSL. Gates of the memory cells F1 to F16 may be connected to a plurality of word lines WL1 to WL16. A group of memory cells connected to the same word line among memory cells included in different strings may be referred to as a physical page PPG. Therefore, physical pages corresponding to the number of the word lines WL1 to WL16 may be included in the memory block BLKa.

One memory cell may store data of one bit. The memory cell is generally referred to as a single level cell (SLC). One physical page PPG may store one logical page (LPG) data. The one LPG data may include data bits of which number corresponds to that of cells included in one physical page PPG. Alternately, one memory cell MC may store data of two or more bits. The memory cell is generally referred to as a multi-level cell (MLC). One physical page PPG may store two or more LPG data.

A memory cell for storing data of two or more bits is referred to as the MLC. As the number of bits of data stored in one memory cell increases, the MLC has recently meant as a memory cell for storing data of two bits. A memory cell for storing data of three or more bits is referred to as a triple level cell (TLC), and a memory cell for storing data of four or more bits is referred to as a quadruple level cell (QLC). Besides, memory cells for storing data of a plurality of bits have been developed, and this embodiment may be applied to memory systems in which data of two or more bits are stored.

In another embodiment, each of the plurality of memory blocks may have a three-dimensional structure. Each memory block may include a plurality of memory cells stacked on a substrate. The plurality of memory cells may be arranged along +X, +Y, and +Z directions.

Figure 4A:
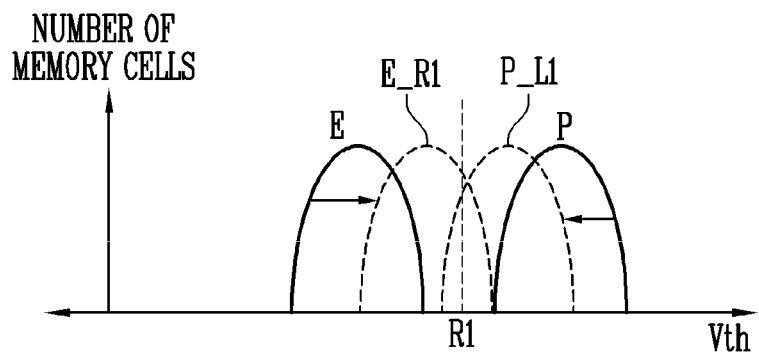
FIG. 4A illustrates a threshold voltage distribution change of memory cells when temperature is relatively low.
Figure 4B:
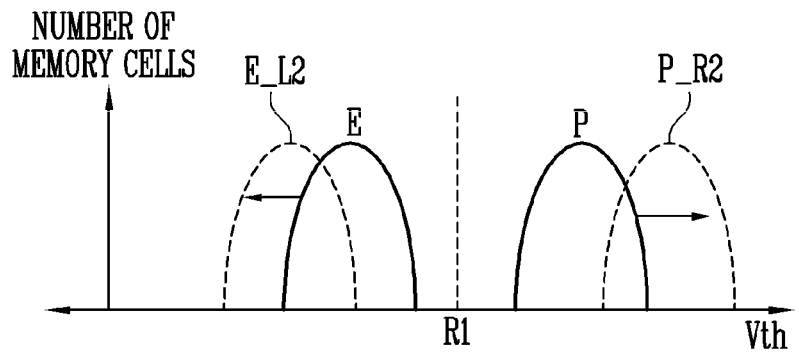
FIG. 4B illustrates a threshold voltage distribution change of memory cells when temperature is relatively high.
Figure 4C:
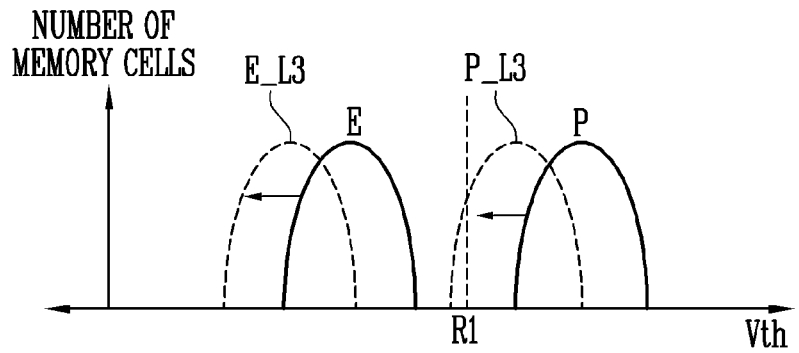
FIG. 4C illustrates a threshold voltage distribution change of memory cells due to retention.

FIGS. 4A to 4C illustrate threshold voltage distribution changes of memory cells.

FIGS. 4A to 4C each illustrate a threshold voltage distribution of memory cells when the memory device 100 shown in FIG. 1 performs a program operation by using a single level cell (SLC) method. FIGS. 4A to 4C may also be applied when the memory device 100 performs the program operation by using a multi-level cell (MLC), triple level cell (TLC), or quadruple level cell (QLC) method.

FIG. 4A illustrates a threshold voltage distribution of memory cells when a temperature is relatively low, FIG. 4B illustrates a threshold voltage distribution of memory cells when the temperature is relatively high, and FIG. 4C illustrates a threshold voltage distribution of memory cells due to retention. In each of FIGS. 4A to 4C, a horizontal axis represents a magnitude of a threshold voltage Vth of memory cells, and a vertical axis represents the number of memory cells.

In an embodiment, when the memory device 100 performs a program operation by using the SLC method, each of memory cells may have one of an erase state E and a program state P. A voltage for distinguishing the erase state E and the program state P from each other may be a voltage R1. Therefore, in a read operation following the program operation, the read operation may be performed by using the voltage R1 so as to distinguish the erase state E and the program state P from each other.

In an embodiment, when the memory device 100 performs an erase operation, memory cells having the program state P may be changed to the erase state E.

In an embodiment, a threshold voltage distribution of the memory cells may be changed due to a temperature when the memory device 100 performs the program operation or the erase operation or due to retention.

Referring to FIG. 4A, when the memory device 100 performs the program operation or the erase operation in a relatively low temperature, a charge movement speed of the memory cells may be decreased. As a result, the memory cells may be programmed to a state P_L1 in the program operation, and be erased to a state E_R1 in the erase operation. A threshold voltage of a memory cell is shifted to a lower level in the state P_L1 than in the state P, and a threshold voltage of a memory cell is shifted to a higher level in the state E_R1 than in the state E.

Referring to FIG. 4B, when the memory device 100 performs the program operation or the erase operation in a relatively high temperature, the charge movement speed of the memory cells may be increased. As a result, the memory cells may be programmed to a state P_R2 in the program operation, and be erased to a state E_L2 in the erase operation. A threshold voltage of a memory cell is shifted to a higher level in the state P_R2 than in the state P, and a threshold voltage of a memory cell is shifted to a lower level in the state E_L2 than in the state E.

Referring to FIG. 4C, the threshold voltage distribution of the memory cells may be shifted to the left due to retention. That is, when a long time elapses after data is stored in the memory device 100, the threshold voltage distribution of the memory cells may be shifted to lower threshold voltages due to movement of charges of the memory cells.

Therefore, a threshold voltage distribution of memory cells having the program state P may be changed to the threshold voltage distribution corresponding to the state P_L3, and a threshold voltage distribution of memory cells having the erase state E may be changed to the threshold voltage distribution corresponding to E_L3. That is, a threshold voltage of a memory cell is shifted to a lower level in the state P_L3 than in the state P, and a threshold voltage of a memory cell is shifted to a lower level in the state E_L3 than in the state E.

Consequently, the threshold voltage distribution of the memory cells may be changed due to the temperature in the program operation or the erase operation of the memory device 100 and/or the retention. Therefore, if the threshold voltage distribution of the memory cells is changed, the program state P and the erase state E may not be distinguished from each other when the read operation is performed using the voltage R1.

Accordingly, in the read operation, it is necessary to adjust read voltages based on a temperature measured during the program operation or the erase operation of the memory device 100 and/or the retention.

Figure 5:
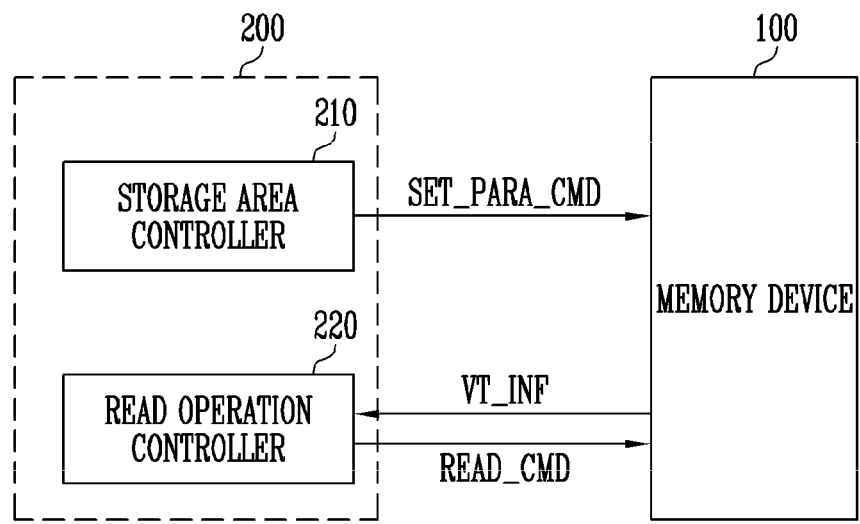
FIG. 5 illustrates a configuration and an operation of a memory controller shown in FIG. 1.

FIG. 5 illustrates a configuration and an operation of the memory controller 200 shown in FIG. 1 in accordance with an embodiment.

FIG. 5 illustrates operations of the storage area controller 210 and the read operation controller 220 included in the memory controller 200.

In an embodiment, in a booting operation or an initialization operation of the storage device 50 shown in FIG. 1, the storage area controller 210 may set an area in which temperature information is to be stored in the memory device 100. The temperature information may include information on a temperature measured by the memory device 100 in a program operation or an erase operation. Specifically, the storage area controller 210 may output, to the memory device 100, a set parameter command SET_PARA_CMD for instructing the memory device 100 to set the area in which the temperature information is to be stored.

In an embodiment, the memory device 100 may set the area in which the temperature information is to be stored, in response to the set parameter command SET_PARA_CMD. For example, the memory device 100 may set, as the area in which the temperature information is to be stored, a page at a specific position among pages included in each memory block (e.g., a last page of each memory block), a specific memory block among a plurality of memory blocks, or a register, in response to the set parameter command SET_PARA_CMD.

When the area in which the temperature information is to be stored is set, the memory device 100 may measure the temperature in the program operation or the erase operation, and store the temperature information in the set area.

In an embodiment, the read operation controller 220 may control a read operation performed in the memory device 100.

For example, when a read command READ_CMD is received from the memory controller 200, the memory device 100 may determine a read voltage and a pass voltage, which are to be used in the read operation, based on retention and/or the temperature measured in the program operation or the erase operation. Also, the memory device 100 may provide the read operation controller 220 with voltage information VT_INF including information on the determined read voltage and the determined pass voltage.

When the voltage information VT_INF is received from the memory device 100, the read operation controller 220 may control the read operation on a selected page, the read operation being performed by using the determined read voltage and the determined pass voltage.

For example, when a read request for the selected page corresponding to the voltage information VT_INF is received from the host 300 shown in FIG. 1 after the voltage information VT_INF is received from the memory device 100, the read operation controller 220 may output, to the memory device 100, a read command READ_CMD for instructing the memory device 100 to perform a read operation using the read voltage and the pass voltage corresponding to the voltage information VT_INF. In this case, the memory device 100 may omit the operation of determining the read voltage and the pass voltage, which are to be used in the read operation, based on the retention and/or the temperature measured in the program operation or the erase operation, and immediately perform the read operation in response to the read command READ_CMD. Thus, a speed of the read operation can be increased.

Figure 6:
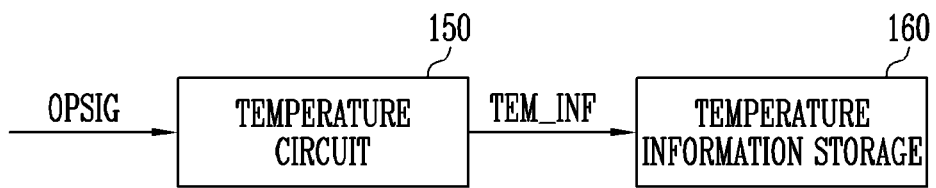
FIG. 6 illustrates a process of storing a temperature measured in an operation of a memory device.

FIG. 6 illustrates a process of storing a temperature measured in the memory device 100 shown in FIG. 1.

FIG. 6 illustrates the temperature circuit 150 shown in FIG. 1 and the temperature information storage 160 shown in FIG. 1. In FIG. 6, an operation signal OPSIG may correspond to the operation signal OPSIG shown in FIG. 2. The operation signal OPSIG may be a signal for instructing the memory device 100 to perform a program operation or a signal for instructing the memory device 100 to perform an erase operation.

In an embodiment, the temperature circuit 150 may measure a temperature in response to the operation signal OPSIG. Specifically, the temperature circuit 150 may measure the temperature when the program operation or the erase operation is started, after the program operation or the erase operation is ended, or at a specific time during the program operation or the erase operation.

In an embodiment, the temperature circuit 150 may generate temperature information TEM_INF including information on the measured temperature for each page. That is, since the program operation is performed for each page, the temperature information TEM_INF may be generated for each page. However, since the erase operation is performed for each block, the temperature information TEM_INF may be generated with respect to all pages in a memory block on which the erase operation is performed.

The temperature information TEM_INF may be data which is not randomized. When a randomizer exists in the memory device 100 shown in FIG. 1 and has the same structure as that included in the memory controller 200 shown in FIG. 1, the temperature information TEM_INF may be randomized data.

The temperature circuit 150 may output the temperature information TEM_INF to the temperature information storage 160.

In an embodiment, the temperature information storage 160 may be set in response to the set parameter command SET_PARA_CMD output from the storage area controller 210 shown in FIG. 5.

The temperature information storage 160 may store the temperature information TEM_INF output from the temperature circuit 150 for each page. The temperature information storage 160 may store the temperature information TEM_INF a specific number of times (e.g., eight times).

When the temperature information TEM_INF is stored the specific number of times, the validity of the temperature information TEM_INF may be checked through majority check.

FIG. 7 illustrates temperature information stored in the temperature information storage 160 shown in FIG. 6.

Referring to FIGS. 6 and 7, FIG. 7 illustrates temperature information TEM_INF corresponding (1_1)th to (1_4)th pages PAGE1_1 to PAGE1_4 stored in the temperature information storage 160. For example, the (1_1)th to (1_4)th pages PAGE1_1 to PAGE1_4 may correspond to pages included in a first memory block BLK1 among the plurality of memory blocks BLK1 to BLKz shown in FIG. 2.

Although a case where the (1_1)th to (1_4)th pages PAGE1_1 to PAGE1_4 are included in the first memory block BLK1 is illustrated in FIG. 7, a smaller number of pages or a larger number of pages may be included in the first memory block BLK1. Also, although only pages in the first memory block BLK1 is illustrated, the present disclosure may also be applied to each of the other memory blocks among the plurality of memory blocks BLK1 to BLKz.

In an embodiment, when the memory device 100 shown in FIG. 1 performs a program operation or an erase operation on each page, the temperature circuit 150 shown in FIG. 6 may measure a temperature in response to the operation signal OPSIG, and may generate temperature information TEM_INF including information on the measured temperature. The generated temperature information TEM_INF may be stored in the temperature information storage 160 shown in FIG. 6.

For example, when the memory device 100 performs a program operation on the (1_1)th page PAGE1_1, a measured temperature may be T_PGM11. Also, when the memory device 100 performs a program operation on the (1_3)th page PAGE1_3, a measured temperature may be T_PGM31.

Each measured temperature may be stored, in the temperature information storage 160, as a temperature corresponding to a corresponding page in each program operation. That is, T_PGM11 may be stored as a temperature measured in the program operation performed on the (1_1)th page PAGE1_1, and T_PGM31 may be stored as a temperature measured in the program operation performed on the (1_3)th page PAGE1_3.

After the program operations are performed on the (1_1)th page PAGE1_1 and the (1_3)th page PAGE1_3, the memory device 100 may perform an erase operation on the first memory block BLK1. A temperature measured in the erase operation that is performed on the first memory block BLK1 may be T_ERS1. Since the erase operation is performed in units of memory blocks, T_ERS1 as the measured temperature may be stored as a temperature corresponding to each of the (1_1)th to (1_4)th pages PAGE1_1 to PAGE1_4 in the temperature information storage 160.

Subsequently, when the memory device 100 performs a program operation on the (1_1)th page PAGE1_1, a measured temperature may be T_PGM13. Therefore, T_PGM13 as a temperature corresponding to the (1_1)th page PAGE1_1 may be stored in the temperature information storage 160.

Also, when the memory device 100 performs a program operation on the (1_2)th page PAGE1_2, a measured temperature may be T_PGM21. Therefore, T_PGM21 as a temperature corresponding to the (1_2)th page PAGE1_2 may be stored in the temperature information storage 160.

Subsequently, when the memory device 100 may perform a program operation on the (1_2)th page PAGE1_2 again, a measured temperature may be T_PGM22. Therefore, T_PGM22 as a temperature corresponding to the (1_2)th page PAGE1_2 may be stored in the temperature information storage 160.

In an embodiment, the temperature information storage 160 may provide temperature information TEM_INF corresponding to each page according to a temperature information request. The temperature information storage 160 may provide, as the temperature information TEM_INF, a last stored temperature among temperatures corresponding to each page.

For example, in a temperature information request for the (1_1)th page PAGE1_1, the temperature information storage 160 may provide the last stored temperature, i.e., T_PGM13, as temperature information TEM_INF corresponding to the (1_1)th page PAGE1_1.

Likewise, in a temperature information request for the (1_2)th page PAGE1_2, the temperature information storage 160 may provide the last stored temperature, i.e., T_PGM22, as temperature information TEM_INF corresponding to the (1_2)th page PAGE1_2.

In addition, in a temperature information request for the (1_3)th page PAGE1_3 or the (1_4)th page PAGE1_4, the temperature information storage 160 may provide the last stored temperature, i.e., T_ERS1, as temperature information TEM_INF corresponding to the (1_3)th page PAGE1_3 or the (1_4)th page PAGE1_4.

FIGS. 8A and 8B illustrate voltages stored in a reference voltage table.

FIGS. 8A and 8B illustrates reference read voltages and reference pass voltages, which are included in the reference voltage table 170 shown in FIG. 1.

FIG. 8A illustrates reference read voltages and reference pass voltages according to temperatures measured in a program operation, and FIG. 8B illustrates reference read voltages and reference pass voltages according to temperatures measured in an erase operation. The reference read voltages may correspond to voltages applied to a selected word line corresponding to a selected page on which the read operation is to be performed, and the reference pass voltages may correspond to voltages applied to unselected word lines except the selected word line, in the read operation.

In an embodiment, the reference voltage table 170 may include information on optimum read voltages and optimum pass voltages determined based on retention and a temperature in a program operation, or retention and a temperature in an erase operation. That is, the reference voltage table 170 may include reference read voltages and reference pass voltages, which are experimentally determined based on the retention and the temperature in each of the program and erase operations.

Referring to FIG. 8A, the reference read voltages and the reference pass voltages may be determined according to temperatures measured when the memory device 100 shown in FIG. 1 performs a program operation.

For example, when a temperature measured in a program operation that is performed on a corresponding page is T11, a read voltage may be determined as VREADR11 and a pass voltage may be determined as VPASSR11, in a read operation to be performed on the corresponding page.

When the temperature measured in the program operation on the corresponding page is T12, the read voltage may be determined as VREADR12 and the pass voltage may be determined as VPASSR12, in the read operation to be performed on the corresponding page.

When the temperature measured in the program operation on the corresponding page is T13, the read voltage may be determined as VREADR13 and the pass voltage may be determined as VPASSR13, in the read operation to be performed on the corresponding page.

When the temperature measured in the program operation on the corresponding page is T14, the read voltage may be determined as VREADR14 and the pass voltage may be determined as VPASSR14, in the read operation to be performed on the corresponding page.

Referring to FIG. 8B, reference read voltages and reference pass voltages may be determined according to temperatures measured when the memory device 100 shown in FIG. 1 performs an erase operation.

For example, when a temperature measured in an erase operation that is performed on a specific memory block is T21, a read voltage may be determined as VREADR21 and a pass voltage may be determined as VPASSR21, in a read operation to be performed on pages in the specific memory block. The read operation on the pages in the specific memory block on which the erase operation has been performed may be performed when an error occurs in map information representing that data has been programmed or when the map information is not updated, or the read operation may be performed to distinguish valid data and invalid data from each other. Also, the read operation on the pages in the specific memory block on which the erase operation has been performed may be performed to detect a page having a probability that an error will occur.

In the same manner, when the temperature measured in the erase operation is T22, the read voltage may be determined as VREADR22 and the pass voltage may be determined as VPASSR22, in the read operation to be performed on the pages in the specific memory block on which the erase operation has been performed.

When the temperature measured in the erase operation is T23, the read voltage may be determined as VREADR23 and the pass voltage may be determined as VPASSR23, in the read operation to be performed on the pages in the specific memory block on which the erase operation has been performed.

When the temperature measured in the erase operation is T24, the read voltage may be determined as VREADR24 and the pass voltage may be determined as VPASSR24, in the read operation to be performed on the pages in the specific memory block on which the erase operation has been performed.

Figure 9:
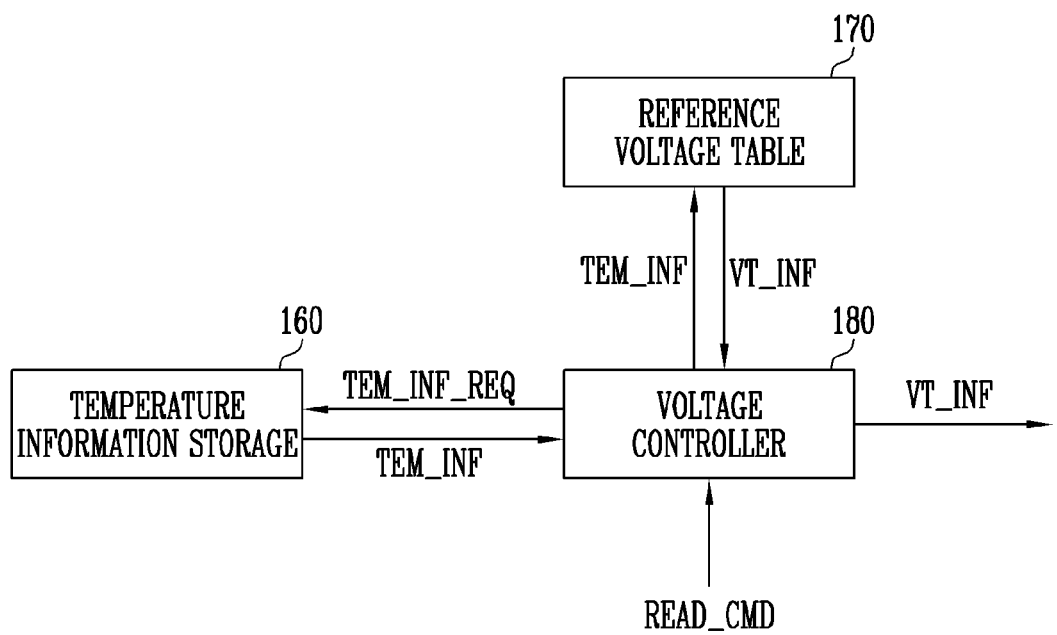
FIG. 9 illustrates a method in which a voltage controller determines a read voltage and a pass voltage.

FIG. 9 illustrates a method in which a voltage controller determines a read voltage and a pass voltage.

FIG. 9 illustrates operations of the temperature information storage 160, the reference voltage table 170, and the voltage controller 180, which are shown in FIG. 1.

In an embodiment, the voltage controller 180 may receive a read command READ_CMD from the memory controller 200 shown in FIG. 1. The read command READ_CMD is a command corresponding to a read request received from the host 300 shown in FIG. 1, and may instruct the memory device 100 shown in FIG. 1 to read data stored in a selected page. When the voltage controller 180 receives the read command READ_CMD, the voltage controller 180 may output, to the temperature information storage 160, a temperature information request TEM_INF_REQ for acquiring temperature information TEM_INF of the selected page, in respond to the read command READ_CMD.

In an embodiment, the temperature information storage 160 may provide the voltage controller 180 with the temperature information TEM_INF corresponding to the selected page in response to the temperature information request TEM_INF_REQ. The temperature information TEM_INF may include information on a temperature last stored in the temperature information storage 160 among temperatures corresponding to the selected page. The temperature information TEM_INF may include information on a temperature measured in a program operation performed on the selected page or a temperature measured in an erase operation performed on the selected page.

In an embodiment, the voltage controller 180 may provide the reference voltage table 170 with the temperature information TEM_INF received from the temperature information storage 160.

The reference voltage table 170 may provide the voltage controller 180 with voltage information VT_INF on reference voltages corresponding to the temperature information TEM_INF received from the voltage controller 180. For example, when the temperature information TEM_INF includes information on a temperature measured in a program operation, the reference voltage table 170 may provide, as the voltage information VT_INF, information on a reference read voltage and a reference pass voltage, which correspond to the temperature measured in the corresponding program operation, to the voltage controller 180.

In an embodiment, the voltage controller 180 may output the voltage information VT_INF, such that a read operation corresponding to the read command READ_CMD is performed based on the voltage information VT_INF.

The memory device 100 shown in FIG. 1 may perform the read operation based on the voltage information VT_INF output from the voltage controller 180. That is, the memory device 100 may perform the read operation by applying the reference read voltage included in the voltage information VT_INF to a selected word line corresponding to the selected page and applying the reference pass voltage included in the voltage information VT_INF to unselected word lines except the selected word line.

In an embodiment, the voltage controller 180 may output the voltage information VT_INF to the memory controller 200 shown in FIG. 1. When a subsequent read operation following the read operation is requested on the page on which the read operation has been performed, the memory controller 200 may control, based on the voltage information VT_INF, the memory device 100 to perform the subsequent read operation on the page.

That is, when a read request for a given page is received again from the host 300 shown in FIG. 1 after a previous read operation has been performed on the given page, the memory controller 200 may output, to the memory device 100, a read command READ_CMD for instructing the memory device 100 to perform a subsequent read operation on the given page by using a reference read voltage and a reference pass voltage, which are included in voltage information VT_INF and have been used to perform the previous read operation.

Embodiments in which the memory device 100 provides the voltage information VT_INF will be described in more detail with reference to FIGS. 10A and 10B.

Figure 10A:
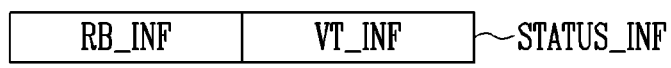
FIG. 10A illustrates a method in which voltage information is included in state information and provided to a memory controller.
Figure 10B:
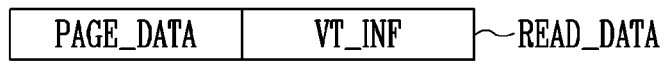
FIG. 10B illustrates a method in which voltage information is included in read data and provided to a memory controller.

FIGS. 10A and 10B illustrate methods for providing voltage information to a memory controller.

FIGS. 10A and 10B illustrate methods in which the voltage controller 180 shown in FIG. 9 determines a reference read voltage and a reference pass voltage, which are to be used in a read operation, and then provides the memory controller 200 shown in FIG. 1 with voltage information VT_INF including information on the reference read voltage and the reference pass voltage.

Referring to FIG. 10A, the voltage information VT_INF may be included in status information STATUS_INF to be provided to the memory controller 200 shown in FIG. 1. In FIG. 10A, the status information STATUS_INF includes ready busy information RB_INF and the voltage information VT_INF. However, in another embodiment, more information may be included in the status information STATUS_INF.

In FIG. 10A, the ready busy information RB_INF may represent whether a status of the memory device 100 shown in FIG. 1 is a ready status or a busy status, and the voltage information VT_INF may include information on a reference read voltage and a reference pass voltage, which are used when the memory device 100 performs a read operation on a selected page.

In an embodiment, the memory controller 200 may request information on the status of the memory device 100. The memory device 100 may output the status information STATUS_INF representing the status of the memory device 100 to the memory controller 200 in response to a request received from the memory controller 200. The memory device 100 may generate the status information STATUS_INF including the voltage information VT_INF and output the generated status information STATUS_INF to the memory controller 200.

Referring to FIG. 10B, the voltage information VT_INF may be included in read data READ_DATA to be provided to the memory controller 200 in response to a read command received from the memory controller 200.

In FIG. 10B, the read data READ_DATA includes page data PAGE_DATA stored in a selected page and the voltage information VT_INF. In another embodiment, more information may be included in the read data READ_DATA. The voltage information VT_INF included in the read data READ_DATA may include information on a reference read voltage and a reference pass voltage, which are used when the memory device 100 performs a read operation on the selected page.

As described above, the voltage information VT_INF may be provided to the memory controller 200 through the use of the status information STATUS_INF or the read data READ_DATA. When the voltage information VT_INF is provided to the memory controller 200, the memory controller 200 may control, based on the voltage information VT_INF, the memory device 100 to perform a subsequent read operation on the selected page on which the read operation has been performed.

That is, when a read request on the selected page is received again from the host 300 after the read operation has been performed, the memory controller 200 may output, to the memory device 100, a read command READ_CMD for instructing the memory device 100 to perform a subsequent read operation by using the reference read voltage and the reference pass voltage that are included in the voltage information VT_INF.

Figure 11:
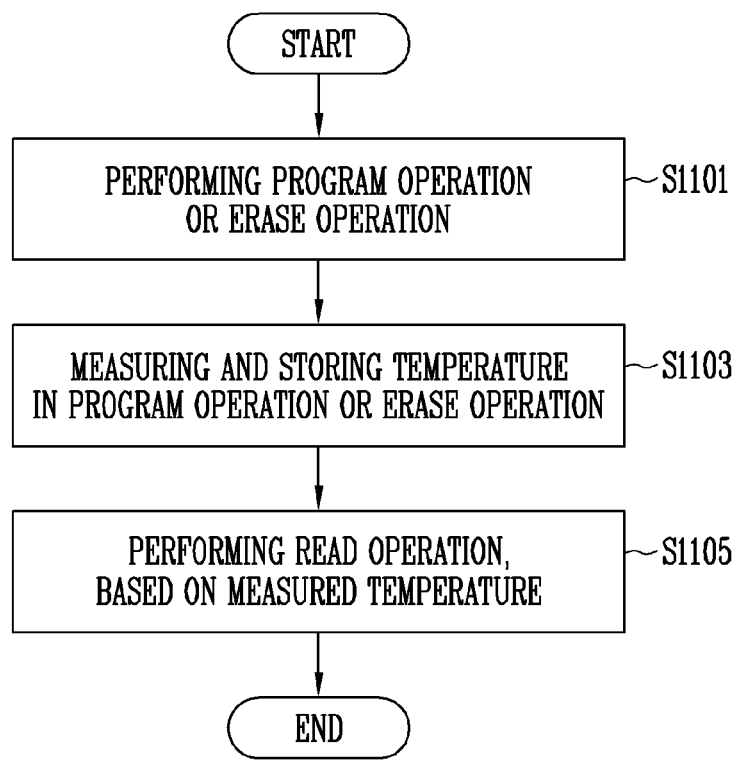
FIG. 11 illustrates an operation of a memory device in accordance with an embodiment of the present disclosure.

FIG. 11 illustrates an operation of a memory device in accordance with an embodiment of the present disclosure.

Referring to FIG. 11, in step S1101, the memory device may perform a program operation or an erase operation. For example, when a program command corresponding to a program request is received from a memory controller, the memory device may perform a program operation of programming data in a page corresponding to the program command. Also, when an erase command corresponding to an erase request is received from the memory controller, the memory device may perform an erase operation on a memory block corresponding to the erase command.

In step S1103, the memory device may measure a temperature in the program operation or the erase operation, and store the measured temperature. For example, the memory device may measure the temperature when the program operation or the erase operation is started, after the program operation or the erase operation is ended, or at a specific time during the program operation or the erase operation, and store the measured temperature.

In step S1105, the memory device may perform a read operation based on the measured temperature. Specifically, when a read command corresponding to a read request is received from the memory controller, the memory device may perform a read operation on a page on which the read command is to be executed, based on a temperature corresponding to the corresponding page.

Figure 12:
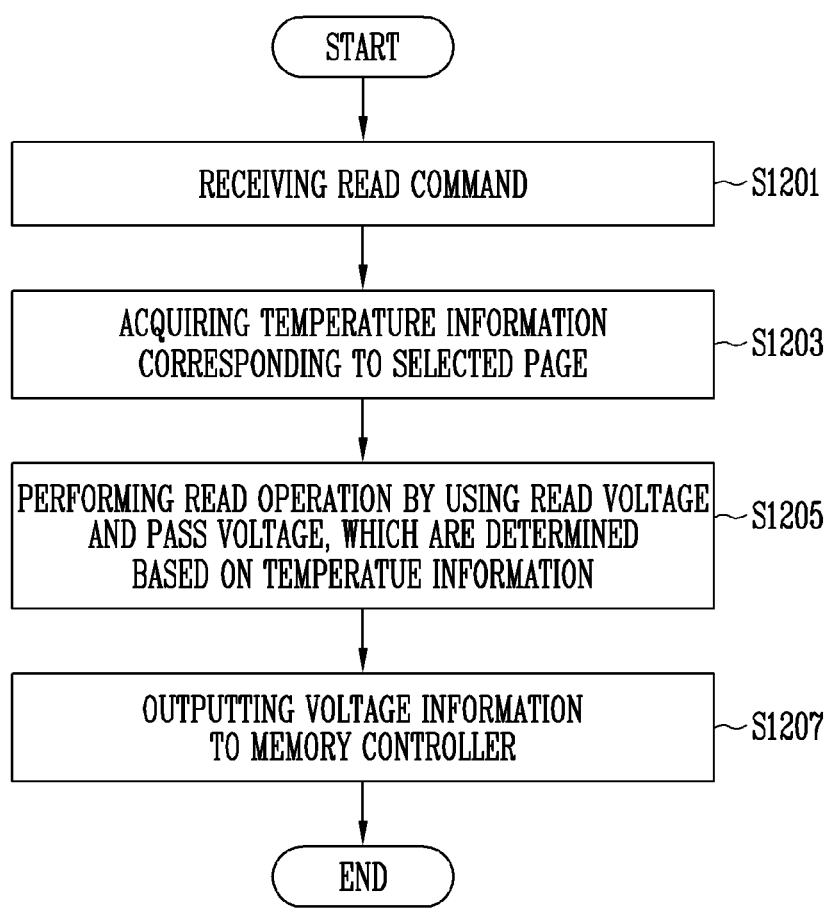
FIG. 12 illustrates an operation of a memory device in accordance with an embodiment of the present disclosure.

FIG. 12 illustrates an operation of a memory device in accordance with an embodiment of the present disclosure. FIG. 12 illustrates steps obtained by subdividing the step S1105 shown in FIG. 11.

In step S1201, the memory device may receive a read command from the memory controller. The read command may be a command for instructing the memory device to read data stored in a selected page among a plurality of pages included in the memory device.

In step S1203, the memory device may acquire temperature information corresponding to the selected page. Specifically, when the read command for the selected page is received after a temperature measured in a program operation or an erase operation on the selected page is stored, a temperature last stored for the selected page may be acquired as the temperature information corresponding to the selected page. Therefore, the temperature information may include information on the temperature measured in the program operation or the temperature measured in the erase operation.

In step S1205, the memory device may perform a read operation on the selected page by using a read voltage and a pass voltage, which are determined based on the temperature information.

Specifically, when the temperature information on the selected page is received, the memory device may acquire, from a reference voltage table, a reference read voltage and a reference pass voltage, which correspond to the temperature information. The reference voltage table may include information on optimum read voltages and optimum pass voltages, which are experimentally determined based on the temperature measured in the program operation or the temperature measured in the erase operation.

When the temperature information includes information on the temperature measured in the program operation, the memory device may acquire a reference read voltage and a reference pass voltage, which correspond to the temperature measured in the program operation, from the reference voltage table. Alternatively, when the temperature information includes information on the temperature measured in the erase operation, the memory device may acquire a reference read voltage and a reference pass voltage, which correspond to the temperature measured in the erase operation, from the reference voltage table.

In an embodiment, when the reference read voltage and the reference pass voltage are acquired from the reference voltage table, the memory device may perform the read operation by setting the reference read voltage and the reference pass voltage respectively as a read voltage and a pass voltage.

In step S1207, the memory device may output voltage information to the memory controller. The voltage information may include the read voltage and the pass voltage, which are determined in the step S1205. When the read voltage and the pass voltage are determined in the step S1205, the memory device may output the voltage information itself to the memory controller. Alternatively, the memory device may include the voltage information in status information and then output the status information to the memory controller, or include the voltage information in read data and then output the read data to the memory controller.

Figure 13:
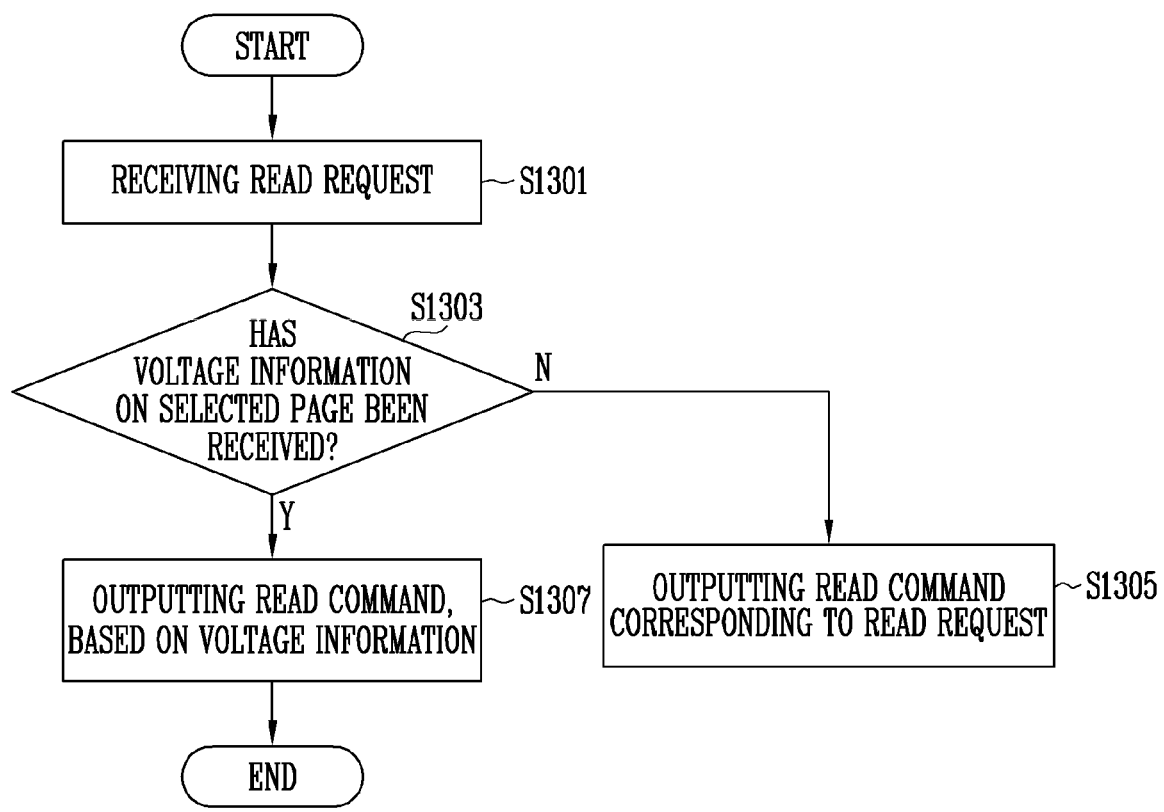
FIG. 13 illustrates an operation of a memory controller in accordance with an embodiment of the present disclosure.

FIG. 13 illustrates an operation of a memory controller in accordance with an embodiment of the present disclosure.

Referring to FIG. 13, in step S1301, the memory controller may receive a read request from a host. The read request may be a request for acquiring data stored in a selected page among a plurality of pages included in a memory device.

In step S1303, the memory controller may determine whether voltage information on the selected page has been received from the memory device. That is, the memory controller may determine whether information on read and pass voltages used in a previous read operation performed on the selected page has been received from the memory device before the read request for the selected page is received from the host.

When the voltage information has not been received from the memory device (N), the memory controller proceeds to step S1305. In the step S1305, the memory controller may generate a read command corresponding to the read request and output the generated read command to the memory device. The memory device may determine a read voltage and a pass voltage based on temperature information corresponding to the selected page, and then perform a read operation by using the determined read and pass voltages in response to the read command.

On the other hand, when the voltage information has been received from the memory device (Y), the memory controller proceeds to step S1307. In the step S1307, the memory controller may generate a read command for instructing the memory device to perform a read operation on the selected page by using a read voltage and a pass voltage, which are included in the voltage information, and output the generated read command to the memory device. Therefore, when the voltage information has been received from the memory device, the operation of determining the read voltage and the pass voltage based on the temperature information corresponding to the selected page is omitted in the memory device, so that the speed of the read operation can be improved. That is, the memory device does not need to perform the operation of determining the read voltage and the pass voltage whenever performing a read operation on the selected page if the voltage information on the selected page is provided to and stored in the memory controller.

Figure 14:
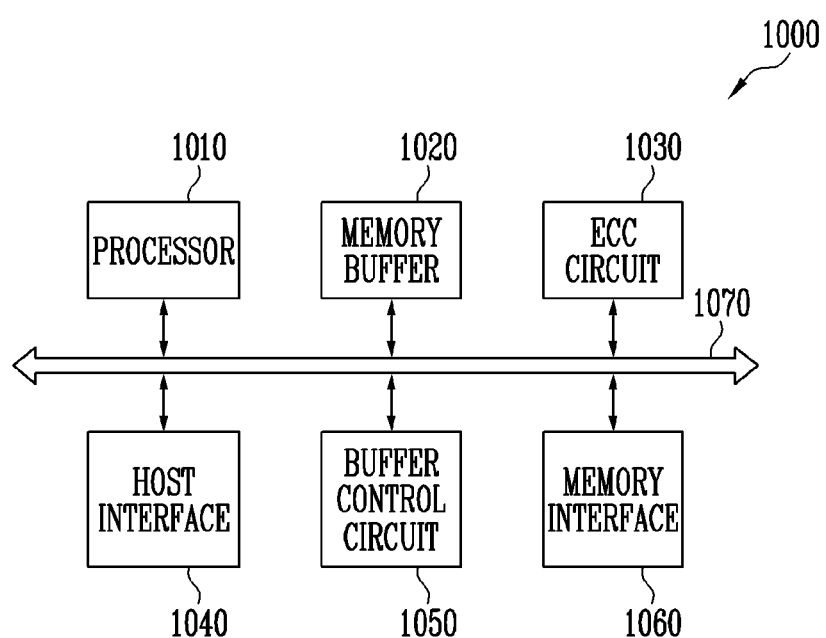
FIG. 14 illustrates a memory controller in accordance with an embodiment of the present disclosure.

FIG. 14 illustrates a memory controller 1000 in accordance with an embodiment of the present disclosure.

Referring to FIG. 14, the memory controller 1000 is connected to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the host through the host interface 1040, and communicate with the memory device through the memory interface 1060. Also, the processor 1010 may communicate with the memory buffer 1020 through the buffer control circuit 1050. The processor 1010 may control an operation of a storage device including the memory device and the memory controller, using the memory buffer 1020 as a working memory, a cache memory, or a buffer memory.

The processor 1010 may perform a function of a flash translation layer (FTL). The processor 1010 may translate a logical block address LBA provided by the host through the FTL into a physical block address PBA. The FTL may receive a logic block address LPA, using a mapping table, to be translated into a physical block address PBA. Several address mapping methods of the FTL exist according to mapping units. A representative address mapping method includes a page mapping method, a block mapping method, or a hybrid mapping method.

The processor 1010 is configured to randomize data received from the host. For example, the processor 1010 may randomize the data received from the host, using a randomizing seed. The randomized data is provided to the memory device, so that the randomized data is programmed in a memory cell array of the memory device.

The processor 1010 may perform randomizing and derandomizing data by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may store data processed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. Exemplarily, the ECC circuit 1030 may be included as a component of the memory interface 1060 in the memory interface 1060.

The host interface 1040 may communicate with the external host under the control of the processor 1010. The host interface 1040 may communicate with the host Host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

Exemplarily, the memory controller 1000 may not include the memory buffer 1020 and the buffer control circuit 1050.

Exemplarily, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

Exemplarily, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

In an embodiment, the processor 1010 may allocate an area in which temperature information is to be stored to the memory device 100 shown in FIG. 1 in a booting operation or an initialization operation. The temperature information may include information on a temperature measured when the memory device 100 performs a program operation or an erase operation.

Specifically, the processor 1010 may allocate, as the area in which the temperature information is to be stored, a page at a specific position among a plurality of pages included in the memory device 100, e.g., a last page of each memory block, a specific memory block among a plurality of memory blocks, or a register. The processor 1010 may output, to the memory device 100, a set parameter command instructing the memory device 100 to allocate the area in which the temperature information is to be stored.

In an embodiment, the processor 1010 may control a read operation to be performed in the memory device 100 based on voltage information received from the memory device 100. The voltage information may include information on a read voltage and a pass voltage, which are determined based on temperature information corresponding to a selected page when the memory device 100 performs the read operation.

For example, when a read request for the selected page is received again from the host 300 shown in FIG. 1 after the read voltage and the pass voltage are determined based on the temperature information corresponding to the selected page, the processor 1010 may generate a read command corresponding to the read request, based on the voltage information, and output the generated read command to the memory device 100.

That is, when the voltage information corresponding to the selected page is received from the memory device 100, the processor 1010 may generate a read command such that the read operation is performed again by using the voltages included in the voltage information, and output the read command to the memory device 100.

In the embodiment shown in FIG. 14, the storage area controller 210 and the read operation controller 220 of FIG. 1 are implemented using the processor 1010. However, embodiments are not limited thereto. In another embodiment, the storage area controller 210 and the read operation controller 220 of FIG. 1 may be implemented using one or more processors other than the processor 1010.

Figure 15:
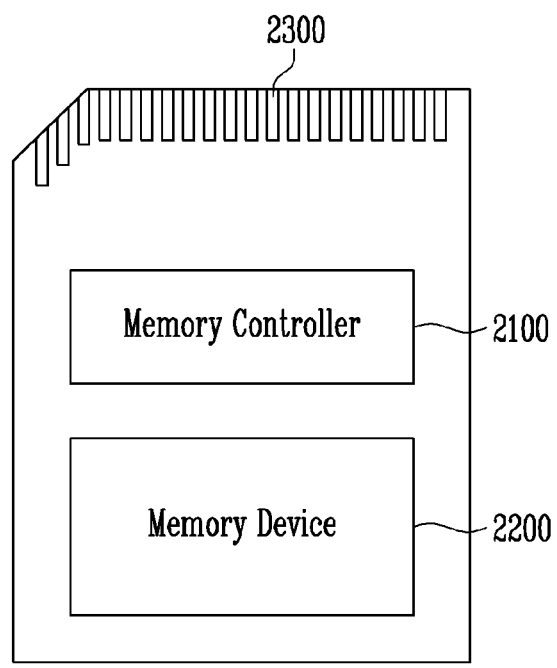
FIG. 15 is a block diagram illustrating a memory card system in accordance with an embodiment of the present disclosure.

FIG. 15 illustrates a memory card system 2000 in accordance with an embodiment of the present disclosure.

Referring to FIG. 15, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented identically to the memory device 100 shown in FIG. 1.

Exemplarily, the memory controller 2100 may include components such as a Random Access Memory (RAM), a processing unit, a host interface, a memory interface, and the error corrector.

The memory controller 2100 may communicate with an external device through the connector 2300. The memory controller 2100 may communicate with the external device (e.g., the host) according to a specific communication protocol. Exemplarily, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

Exemplarily, the memory device 2200 may be implemented with any of various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), a Universal Flash Storage (UFS), or the like.

In an embodiment, the memory controller 2100 may allocate an area in which temperature information is to be stored to the memory device 2200 in a booting operation or an initialization operation. The temperature information may include information on a temperature measured when the memory device 2200 performs a program operation or an erase operation.

Specifically, the memory controller 2100 may allocate, as the area in which the temperature information is to be stored, a page at a specific position among a plurality of pages, e.g., a last page of each memory block, a specific memory block among a plurality of memory blocks, or a register included in the memory device 2200. The memory controller 2100 may output, to the memory device 2200, a set parameter command instructing the memory device 2200 to allocate the area in which the temperature information is to be stored.

In an embodiment, the memory device 2200 may measure a temperature in a program operation or an erase operation, and store the measured temperature as temperature information. The temperature information may be stored for each page. Also, the memory device 2200 may store the temperature information a predetermined number of times.

In an embodiment, after the temperature information is stored, the memory device 2200 may receive a read command from the memory controller 2100. When the read command is received from the memory controller 2100, the memory device 2200 may perform a read operation, based on temperature information on a selected page on which a read operation corresponding to the read command is to be performed.

Specifically, when the temperature information corresponding to the selected page on which the read operation is to be performed is acquired, the memory device 2200 may receive a reference read voltage and a reference pass voltage, which correspond to the temperature information, from a reference voltage table, and determine the received voltages as a read voltage and a pass voltage, which are to be used in the read operation.

For example, when the temperature information includes information on the temperature measured in the program operation, the memory device 2200 may receive a reference read voltage and a reference pass voltage, which correspond to the temperature measured in the program operation, from the reference voltage table, and determine the reference read voltage and the reference pass voltage respectively as a read voltage and a pass voltage, thereby performing the read operation.

When the temperature information includes information on the temperature measured in the erase operation, the memory device 2200 may receive a reference read voltage and a reference pass voltage, which correspond to the temperature measured in the erase operation, from the reference voltage table, and determine the reference read voltage and the reference pass voltage respectively as a read voltage and a pass voltage, thereby performing the read operation.

In an embodiment, the memory device 2200 may provide voltage information to the memory controller 2100 in the read operation. The voltage information may include information on the read voltage and the pass voltage that are determined based on the temperature information corresponding to the selected page. The voltage information may be provided as itself to the memory controller 2100, or be included in status information or read data to be provided to the memory controller 2100.

In an embodiment, the memory controller 2100 may control the read operation to be performed in the memory device 2200, based on the voltage information received from the memory device 2200.

For example, when a read request for the selected page is received again from the host 300 shown in FIG. 1 after the read voltage and the pass voltage are determined based on the temperature information corresponding to the selected page, the memory controller 2100 may generate a read command corresponding to the read request based on the voltage information, and output the generated read command to the memory device 2200.

That is, when the voltage information corresponding to the selected page is received from the memory device 2200, the memory controller 2100 may generate a read command such that the read operation is performed again by using the voltages included in the voltage information, and output the generated read command to the memory device 2200.

Consequently, when the read command for instructing the memory device 2200 to perform the read operation again by using the voltages included in the voltage information is received from the memory controller 2100, the memory device 2200 may omit the operation of determining the read voltage and the pass voltage based on the temperature information, and immediately perform the read operation. Thus, the speed of the read operation can be improved.

Figure 16:
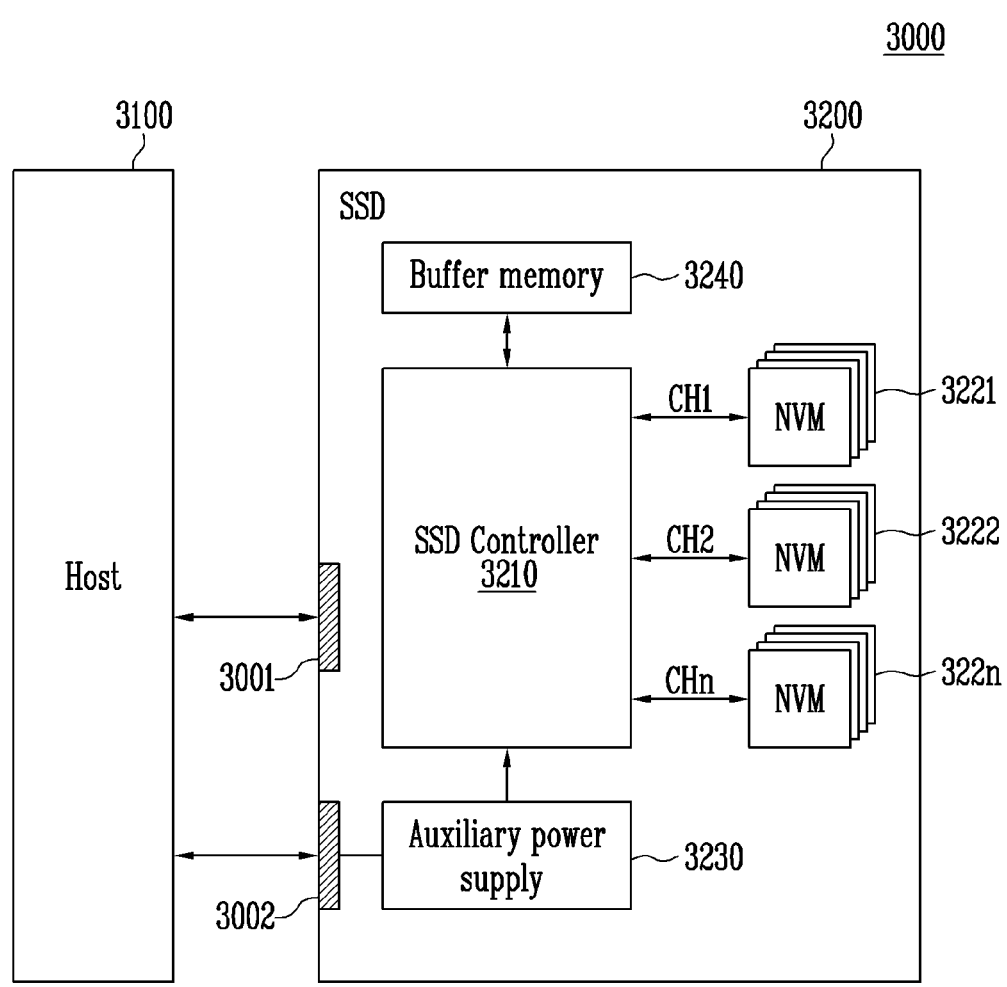
FIG. 16 is a block diagram illustrating a Solid State Drive (SSD) system in accordance with an embodiment of the present disclosure.

FIG. 16 illustrates a Solid State Drive (SSD) system 3000 in accordance with an embodiment of the present disclosure.

Referring to FIG. 16, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 shown in FIG. 1.

The SSD controller 3210 may control the plurality of flash memories 3221 to 322n in response to the signal SIG received from the host 3100. Exemplarily, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power to the SSD 3200. Exemplarily, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. The auxiliary power supply 3230 may receive power PWR input from the host 3100 and charge the power PWR. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In an embodiment, the SSD controller 3210 may allocate an area in which temperature information is to be stored to the plurality of flash memories 3221 to 322n in a booting operation or an initialization operation. The temperature information may include information on a temperature measured when each of the plurality of flash memories 3221 to 322n performs a program operation or an erase operation.

Specifically, the SSD controller 3210 may allocate, as the area in which the temperature information is to be stored, a page at a specific position among a plurality of pages, e.g., a last page of each memory block, a specific memory block among a plurality of memory blocks, or a register included in each of the plurality of flash memories 3221 to 322n. The SSD controller 3210 may output, to the plurality of flash memories 3221 to 322n, a set parameter command instructing the plurality of flash memories 3221 to 322n to allocate the area in which the temperature information is to be stored.

In an embodiment, the plurality of flash memories 3221 to 322n may measure a temperature in a program operation or an erase operation, and store the measured temperature as temperature information. The temperature information may be stored for each page. Also, the plurality of flash memories 3221 to 322n may store the temperature information a predetermined number of times.

In an embodiment, after the temperature information is stored, the plurality of flash memories 3221 to 322n may receive a read command from the SSD controller 3210. When the read command is received from the SSD controller 3210, the plurality of flash memories 3221 to 322n may perform a read operation based on temperature information on a selected page on which the read operation corresponding to the read command is to be performed.

Specifically, when the temperature information corresponding to the selected page on which the read operation is to be performed is acquired, the plurality of flash memories 3221 to 322n may receive a reference read voltage and a reference pass voltage, which correspond to the temperature information, from a reference voltage table, and determine the received voltages as a read voltage and a pass voltage, which are to be used in the read operation.

For example, when the temperature information includes information on the temperature measured in the program operation, the plurality of flash memories 3221 to 322n may receive a reference read voltage and a reference pass voltage, which correspond to the temperature measured in the program operation, from the reference voltage table, and determine the reference read voltage and the reference pass voltage respectively as a read voltage and a pass voltage, thereby performing the read operation.

When the temperature information includes information on the temperature measured in the erase operation, the plurality of flash memories 3221 to 322n may receive a reference read voltage and a reference pass voltage, which correspond to the temperature measured in the erase operation, from the reference voltage table, and determine the reference read voltage and the reference pass voltage respectively as a read voltage and a pass voltage, thereby performing the read operation.

In an embodiment, the plurality of flash memories 3221 to 322n may provide voltage information to the SSD controller 3210. The voltage information may include information on the read voltage and the pass voltage, which are determined based on the temperature information corresponding to the selected page. The voltage information may be provided as itself to the SSD controller 3210, or be included in status information or read data to be provided to the SSD controller 3210.

In an embodiment, the SSD controller 3210 may control the read operation to be performed in the plurality of flash memories 3221 to 322n, based on the voltage information received from the plurality of flash memories 3221 to 322n.

For example, when a read request for the selected page is received again from the host 3100 after the read voltage and the pass voltage are determined based on the temperature information corresponding to the selected page, the SSD controller 3210 may generate a read command corresponding to the read request based on the voltage information, and output the generated read command to the plurality of flash memories 3221 to 322n.

That is, when the voltage information corresponding to the selected page is received from the plurality of flash memories 3221 to 322n, the SSD controller 3210 may generate a read command such that the read operation is performed again by using the voltages included in the voltage information, and output the generated read command to the plurality of flash memories 3221 to 322n.

Consequently, when a read command for instructing the plurality of flash memories 3221 to 322n to perform the read operation again by using the voltages included in the voltage information is received from the SSD controller 3210, the plurality of flash memories 3221 to 322n may omit the operation of determining the read voltage and the pass voltage based on the temperature information, and immediately perform the read operation. Thus, the speed of the read operation can be improved.

Figure 17:
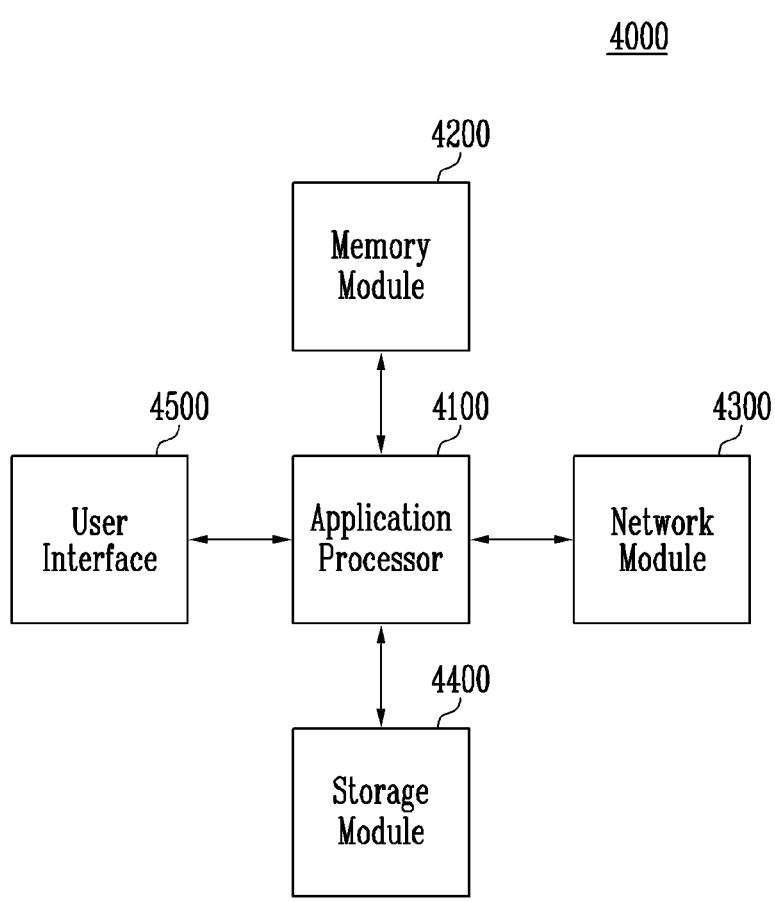
FIG. 17 is a block diagram illustrating a user system in accordance with an embodiment of the present disclosure.

FIG. 17 illustrates a user system 4000 in accordance with an embodiment of the present disclosure.

Referring to FIG. 17, the user system 4000 includes an application processor 4100, a memory module 4200, a network module 4300, a storage module 4400, and a user interface 4500.

The application processor 4100 may drive components included in the user system 4000, an operating system (OS), a user program, or the like. Exemplarily, the application processor 4100 may include controllers for controlling components included in the user system 4000, interfaces, a graphic engine, and the like. The application processor 4100 may be provided as a System-on-Chip (SoC).

The memory module 4200 may operate as a main memory, a working memory, a buffer memory, or a cache memory of the user system 4000. The memory module 4200 may include any of volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or any of nonvolatile random access memories such as a PRAM, a ReRAM, an MRAM, and a FRAM. Exemplarily, the application processor 4100 and the memory module 4200 may be provided as one semiconductor package by being packaged based on a Package on Package (PoP).

The network module 4300 may communicate with external devices. Exemplarily, the network module 4300 may support any of wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. Exemplarily, the network module 4300 may be included in the application processor 4100.

The storage module 4400 may store data. For example, the storage module 4400 may store data received from the application processor 4100. Alternatively, the storage module 4400 may transmit data stored therein to the application processor 4100. Exemplarily, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. Exemplarily, the storage module 4400 may be provided as a removable drive such as a memory card of the user system 4000 or an external drive.

Exemplarily, the storage module 4400 may include a plurality of nonvolatile memory devices, and the plurality of nonvolatile memory devices may operate identically to the memory device described with reference to FIGS. 2 and 3. The storage module 4400 may operate identically to the storage device 50 described with reference to FIG. 1.

The user interface 4500 may include interfaces for inputting data or commands to the application processor 4100 or outputting data to an external device. Exemplarily, the user interface 4500 may include one or more of user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include one or more of user output interfaces such as a Liquid Crystal Display (LCD), an Organic Light Emitting Diode (OLED) display device, an Active Matrix OLED (AMOLED) display device, an LED, a speaker, and a monitor.

In an embodiment, the application processor 4100 may allocate an area in which temperature information is to be stored to the storage module 4400 in a booting operation or an initialization operation. The temperature information may include information on a temperature measured when the storage module 4400 performs a program operation or an erase operation.

Specifically, the application processor 4100 may allocate, as the area in which the temperature information is to be stored, a page at a specific position among a plurality of pages, e.g., a last page of each memory block, a specific memory block among a plurality of memory blocks, or a register included in the storage module 4400. The application processor 4100 may output, to the storage module 4400, a set parameter command instructing the storage module 4400 to allocate the area in which the temperature information is to be stored.

In an embodiment, the storage module 4400 may measure a temperature in a program operation or an erase operation, and store the measured temperature as temperature information. The temperature information may be stored for each page. Also, the storage module 4400 may store the temperature information a predetermined number of times.

In an embodiment, after the temperature information is stored, the storage module 4400 may receive a read command from the application processor 4100. When the read command is received from the application processor 4100, the storage module 4400 may perform a read operation, based on temperature information on a selected page on which a read operation corresponding to the read command is to be performed.

Specifically, when temperature information corresponding to the selected page on which the read operation is to be performed is acquired, the storage module 4400 may receive a reference read voltage and a reference pass voltage, which correspond to the temperature information, from a reference voltage table, and determine the received voltages as a read voltage and a pass voltage, which are to be used in the read operation.

For example, when the temperature information includes information on the temperature measured in the program operation, the storage module 4400 may receive a reference read voltage and a reference pass voltage, which correspond to the temperature measured in the program operation, from the reference voltage table, and determine the reference read voltage and the reference pass voltage respectively as a read voltage and a pass voltage, thereby performing the read operation.

When the temperature information includes information on the temperature measured in the erase operation, the storage module 4400 may receive a reference read voltage and a reference pass voltage, which correspond to the temperature measured in the erase operation, from the reference voltage table, and determine the reference read voltage and the reference pass voltage respectively as a read voltage and a pass voltage, thereby performing the read operation.

In an embodiment, the storage module 4400 may provide voltage information to the application processor 4100. The voltage information may include information on the read voltage and the pass voltage, which are determined based on the temperature information corresponding to the selected page. The voltage information may be provided as itself to the application processor 4100, or be included in status information or read data to be provided to the application processor 4100.

In an embodiment, the application processor 4100 may control the read operation to be performed in the storage module 4400 based on the voltage information received from the storage module 4400.

For example, when a read request for the selected page is received again from the host 300 shown in FIG. 1 after the read voltage and the pass voltage are determined based on the temperature information corresponding to the selected page, the application processor 4100 may generate a read command corresponding to the read request based on the voltage information, and output the generated read command to the storage module 4400.

That is, when the voltage information corresponding to the selected page is received from the storage module 4400, the application processor 4100 may generate a read command such that the read operation is performed again by using the voltages included in the voltage information, and output the generated read command to the storage module 4400.

Consequently, when a read command for instructing the storage module 4400 to perform the read operation again by using the voltages included in the voltage information is received from the application processor 4100, the storage module 4400 may omit the operation of determining the read voltage and the pass voltage based on the temperature information, and immediately perform the read operation. Thus, the speed of the read operation can be improved.

In accordance with the present disclosure, a read voltage and a pass voltage are determined based on a temperature measured in a program operation or an erase operation, so that the reliability of data can be ensured.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device, comprising:
    a plurality of memory blocks each including a plurality of pages;
    a temperature circuit configured to measure a temperature of the memory device when a program operation or an erase operation is performed for each of the plurality of pages;
    a temperature information storage configured to store measured temperature corresponding to each of the plurality of pages; and
    a voltage controller configured to determine, based on the measured temperature of a selected page among the plurality of pages, a read voltage and a pass voltage to be used in a read operation on the selected page among the plurality of pages.

2. The memory device of claim 1, wherein the temperature circuit measures the temperature when the program operation or the erase operation is started or after the program operation or the erase operation is ended.

3. The memory device of claim 1, wherein the temperature information storage is configured with one of the plurality of memory blocks or a page at a specific position among the plurality of pages.

4. The memory device of claim 1, further comprising a reference voltage table including first reference read voltages and first reference pass voltages, which correspond to temperatures measured in the program operation, and second reference read voltages and second reference pass voltages, which correspond to temperatures measured in the erase operation.

5. The memory device of claim 4, wherein the reference voltage table is configured as a one-time programmable (OTP) memory.

6. The memory device of claim 4, wherein the voltage controller:
    determines, as the read voltage and the pass voltage, voltages corresponding to the temperature among the first reference read voltages and the first reference pass voltages when the temperature is a temperature measured in the program operation; and
    determines, as the read voltage and the pass voltage, voltages corresponding to the temperature among the second reference read voltages and the second reference pass voltages when the temperature is a temperature measured in the erase operation.

7. The memory device of claim 1, wherein the voltage controller provides an external controller with voltage information including information on the read voltage and the pass voltage.

8. The memory device of claim 7, wherein, when a status information request is received from the external controller, the voltage controller outputs, to the external controller, status information including the voltage information in response to the state information request.

9. The memory device of claim 7, wherein the voltage controller outputs, as read data, data stored in the selected page and data including the voltage information.

10. A method performed by a memory device that includes a plurality of memory blocks each including a plurality of pages, the method comprising:
    measuring a temperature of the memory device each time program operation or an erase operation is performed for each of the plurality of pages, and storing measured temperature for each page;
    receiving a read command for performing a read operation on a selected page among the plurality of pages from an external controller;
    determining, based on the measured temperature for each page, a read voltage and a pass voltage corresponding to the selected page among the plurality of pages; and
    performing the read operation on the selected page by using the read voltage and the pass voltage.

11. The method of claim 10, further comprising outputting, to the external controller, voltage information including information on the read voltage and the pass voltage.

12. A memory controller for controlling a memory device including a plurality of memory blocks, each of which includes a plurality of pages, the memory controller comprising:
    a storage area controller configured to set an area to store a temperature of the memory device that is measured each time a program operation or an erase operation is performed for each of the plurality of pages; and
    a read operation controller configured to receive, from the memory device, voltage information on a read voltage and a pass voltage to be used for a read operation of a selected page among the plurality of pages, wherein the voltage information is determined based on the measured temperature corresponding to one of the plurality of pages, and control the read operation to be performed in the memory device based on the voltage information.

13. The memory controller of claim 12, wherein, when a read request for a page corresponding to the voltage information is received from a host, the read operation controller outputs, to the memory device, a read command for instructing the memory device to perform the read operation by using the read voltage and the pass voltage, which are included in the voltage information.

14. A storage device, comprising:
    a memory device including a plurality of memory blocks, the memory device measuring a temperature each time a program operation or an erase operation is performed; and
    a memory controller configured to set an area to store measured temperature of the memory device in the memory device, and control a read operation to be performed in the memory device,
    wherein, when a read command for a selected page among a plurality of pages included in each of the plurality of memory blocks is received from the memory controller, the memory device determines a read voltage and a pass voltage to be used for a read operation of the selected page among the plurality of pages, based on the temperature corresponding to the selected page and performs the read operation on the selected page by using the read voltage and the pass voltage.

15. The storage device of claim 14, wherein, when a set parameter command for instructing the memory device to set the area in which the measured temperature is to be stored is received from the memory controller, the memory device sets, as the area in which the measured temperature is to be stored, one of the plurality of memory blocks or a specific page among the plurality of pages.

16. The storage device of claim 14, wherein the memory device measures the temperature when the program operation or the erase operation is started or after the program operation or the erase operation is ended.

17. The storage device of claim 14, wherein, when a status information request is received from the memory controller, the memory device outputs, to the memory controller, status information including voltage information on the read voltage and the pass voltage.

18. The storage device of claim 14, wherein the memory device outputs, as read data, data stored in the selected page and data including voltage information on the read voltage and the pass voltage in response to the read command.

19. The storage device of claim 14, wherein the memory controller receives voltage information on the read voltage and the pass voltage from the memory device, stores the voltage information, and controls a read operation to be performed on the memory device based on the voltage information.

20. The storage device of claim 19, wherein, when a read request for a page corresponding to the voltage information is received from a host, the memory controller outputs, to the memory device, a read command for instructing the memory device to perform the read operation by using the read voltage and the pass voltage, which are included in the voltage information.

* * * * *